(12) United States Patent
Mannella et al.

(10) Patent No.: US 11,990,197 B2
(45) Date of Patent: May 21, 2024

(54) PEAK POWER MANAGEMENT CONNECTIVITY CHECK IN A MEMORY DEVICE

(71) Applicant: Micron Technology, Inc., Boise, ID (US)

(72) Inventors: Eleuterio Mannella, L'Aquila (IT); Massimo Rossini, Rome (IT)

(73) Assignee: Micron Technology, Inc., Boise, ID (US)

( * ) Notice: Subject to any disclaimer, the term of this patent is extended or adjusted under 35 U.S.C. 154(b) by 294 days.

(21) Appl. No.: 17/248,728

(22) Filed: Feb. 4, 2021

(65) Prior Publication Data

US 2022/0199180 A1  Jun. 23, 2022

Related U.S. Application Data

(60) Provisional application No. 63/199,358, filed on Dec. 21, 2020.

(51) Int. Cl.
*G11C 29/38* (2006.01)
*G06F 1/04* (2006.01)
*G06F 1/26* (2006.01)

(52) U.S. Cl.
CPC ............... *G11C 29/38* (2013.01); *G06F 1/04* (2013.01); *G06F 1/26* (2013.01)

(58) Field of Classification Search
CPC ............ G11C 29/38; G11C 2029/5002; G11C 2029/5006; G11C 29/26; G11C 29/021; G11C 29/50; G11C 29/12; G11C 2029/0407; G06F 1/04; G06F 1/26
USPC ........................ 714/715, 718, 719
See application file for complete search history.

(56) References Cited

U.S. PATENT DOCUMENTS

| 7,234,070 | B2 * | 6/2007 | James | G06F 13/4243 |
| | | | | 711/167 |
| 7,505,683 | B1 * | 3/2009 | Lemieux | H04J 14/0221 |
| | | | | 398/4 |
| 9,865,360 | B2 * | 1/2018 | Sharon | G11C 29/44 |
| 10,446,254 | B1 * | 10/2019 | Zehavi | G06F 11/1048 |
| 2007/0021848 | A1 * | 1/2007 | Huang | G01R 31/40 |
| | | | | 700/22 |
| 2008/0222474 | A1 * | 9/2008 | Hiraide | G01R 31/318541 |
| | | | | 714/739 |

(Continued)

*Primary Examiner* — Guy J Lamarre
*Assistant Examiner* — Osman M Alshack
(74) *Attorney, Agent, or Firm* — Lowenstein Sandler LLP (57) ABSTRACT

A memory device includes a plurality of memory dies, each memory die of the plurality of memory dies comprising a memory array and a power management component, operatively coupled with the memory array. The power management component sends a test value to one or more other power management components on one or more other memory dies of the plurality of memory dies and receives one or more other test values from the one or more other power management components. The power management component compares the test value and the one or more other test values to a set of expected values, and responsive to the test value and the one or more other test values matching the set of expected values, determines that signal connections between the power management component and the one or more other power management components are functional.

17 Claims, 5 Drawing Sheets

(56) References Cited

U.S. PATENT DOCUMENTS

| | | | |
|---|---|---|---|
| 2008/0229163 A1* | 9/2008 | Niijima | G11C 29/56 714/719 |
| 2012/0124441 A1* | 5/2012 | Teng | G11C 29/16 714/735 |
| 2012/0319717 A1* | 12/2012 | Chi | G01R 31/318513 324/756.05 |
| 2013/0326263 A1* | 12/2013 | Alameldeen | G06F 11/2205 714/6.2 |
| 2014/0201252 A1* | 7/2014 | Brocker | G06F 11/2205 708/250 |
| 2016/0093400 A1* | 3/2016 | Botea | G11C 29/38 714/719 |
| 2017/0185463 A1* | 6/2017 | Kim | G11C 29/52 |
| 2019/0065089 A1* | 2/2019 | Myers | G06F 3/0625 |

\* cited by examiner

PEAK POWER MANAGEMENT CONNECTIVITY CHECK IN A MEMORY DEVICE

RELATED APPLICATIONS

This application claims the benefit of U.S. Provisional Patent Application No. 63/199,358, filed Dec. 21, 2020, the entire contents of which are hereby incorporated by reference herein.

TECHNICAL FIELD

Embodiments of the disclosure relate generally to memory sub-systems, and more specifically, relate to a peak power management connectivity check in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a peak power management connectivity check in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane. As these processing threads operate independently, the power usage and requirements associated with each processing thread also varies.

The capacitive loading of three-dimensional memory is generally large and may continue to grow as process scaling continues. Various access lines, data lines and voltage nodes can be charged or discharged very quickly during sense (e.g., read or verify), program, and erase operations so that memory array access operations can meet the performance specifications that are often required to satisfy data throughput targets as might be dictated by customer requirements or industry standards, for example. For sequential read or programming, multi-plane operations are often used to increase the system throughput. As a result, a typical memory device can have a high peak current usage, which might be four to five times the average current amplitude. Thus, with such a high average market requirement of total current usage budget, it can become challenging to operate more than four memory devices concurrently, for example.

A variety of techniques have been utilized to manage power consumption of memory sub-systems containing multiple memory devices, many of which rely on a memory sub-system controller to stagger the activity of the memory devices seeking to avoid performing high power portions of access operations concurrently in more than one memory device. For example, in a memory package including multiple memory devices (e.g., multiple separate dies), there can be a peak power management (PPM) system, where each memory device can include a PPM component configured to perform power budget arbitration for the respective memory device. The PPM system employs a token-based round robin protocol, whereby each PPM component rotates (e.g., after a set number of cycles of a shared clock signal) as a holder of the token and broadcasts a quantized current budget consumed by its respective memory device during a given time period. The other PPM components on each other memory device receive this broadcast information and thus, can determine an available current budget in the memory sub-system during the time period. While holding the token, a PPM component can request a certain amount of current for its respective memory device up to the available current budget for the memory package. In most memory subsystems, the PPM components in the memory package communicate with one another (i.e., share clock and data signals) in a closed-loop environment. The clock and data signals shared between the PPM components are not accessible from off the package, and there is no way to validate wire bond fails where the PPM components are connected to signal transmission lines. Thus, the functionality of the PPM system is not able to be tested or validated after assembly of the package or during the lifetime of the memory subsystem. Accordingly, failures in the PPM system can go undetected leading to decreases in the overall performance and quality of service provided by each memory device.

Aspects of the present disclosure address the above and other deficiencies by providing a peak power management connectivity check in a memory device of a memory subsystem. In one embodiment, the memory sub-system includes multiple memory devices implementing a PPM system, where each memory device can include a PPM component. Utilizing the existing signal connections (i.e., clock and data signal connections), the PPM system can perform a connectivity check to verify proper physical connectivity between the PPM components on each die in the package, as well as proper operation of the PPM system itself. In one embodiment, a test sequence is performed where a set of test values is propagated among the PPM components. Each PPM component can broadcast a corresponding value which is received by the other PPM components on each other memory device and stored in respective registers. Upon completion of the test sequence, the values stored in the respective registers are compared to the expected set of values to verify proper operation. A mismatch between the values stored in the respective registers and the expected set of values can indicate a wire bond failure or other connectivity fault in the PPM system.

Advantages of this approach include, but are not limited to, an effective power management scheme for a multi-die memory sub-system. The PPM connectivity check provides the ability to verify the internal connectivity of PPM pads, wires, and other connections without having to operate the memory package in a full test mode. The testing and validation can also be performed more quickly than other methods since all calculations are done by the PPM components on the memory devices themselves, without having to utilize a system-level controller. In addition, the testing provides validation that the PPM system is functioning properly which ensures that the overall performance and quality of service provided by each memory device is improved.

Figure 1:
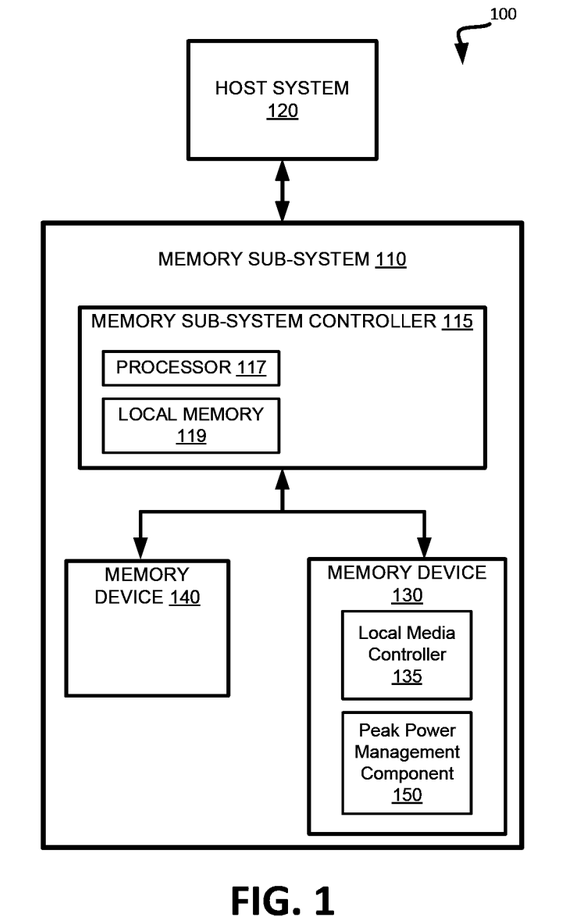
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory device 130 includes peak power management (PPM) component 150. In one embodiment, local media controller 135 of memory device 130 includes at least a portion of PPM component 150. In such an embodiment, PPM component 150 can be implemented using hardware or as firmware, stored on memory device 130, executed by the control logic (e.g., local media controller 135) to perform the operations related to the peak power management connectivity check operations described herein. In other embodiments, PPM component 150 is implemented within memory device 130, but is separate from local media controller 135.

In one embodiment PPM component 150 can perform a connectivity check to verify proper physical connectivity between itself and the PPM components on other memory die in memory sub-system 110. In one embodiment, PPM component 150 can perform a test sequence by propagating a set of test values among the other PPM components. Each PPM component can broadcast a respective test value which is received by the other PPM components on each other memory device and stored in respective registers. Upon completion of the test sequence, any of the PPM components, such as PPM component 150 can compare the values stored in the respective registers to a set of expected values to verify proper operation. A match between the values stored in the respective registers and the set of expected values can indicate that the wire bonds or other connectivity mechanisms in the PPM system are functional. Further details with regards to the operations of PPM component 150 are described below.

Figure 2:
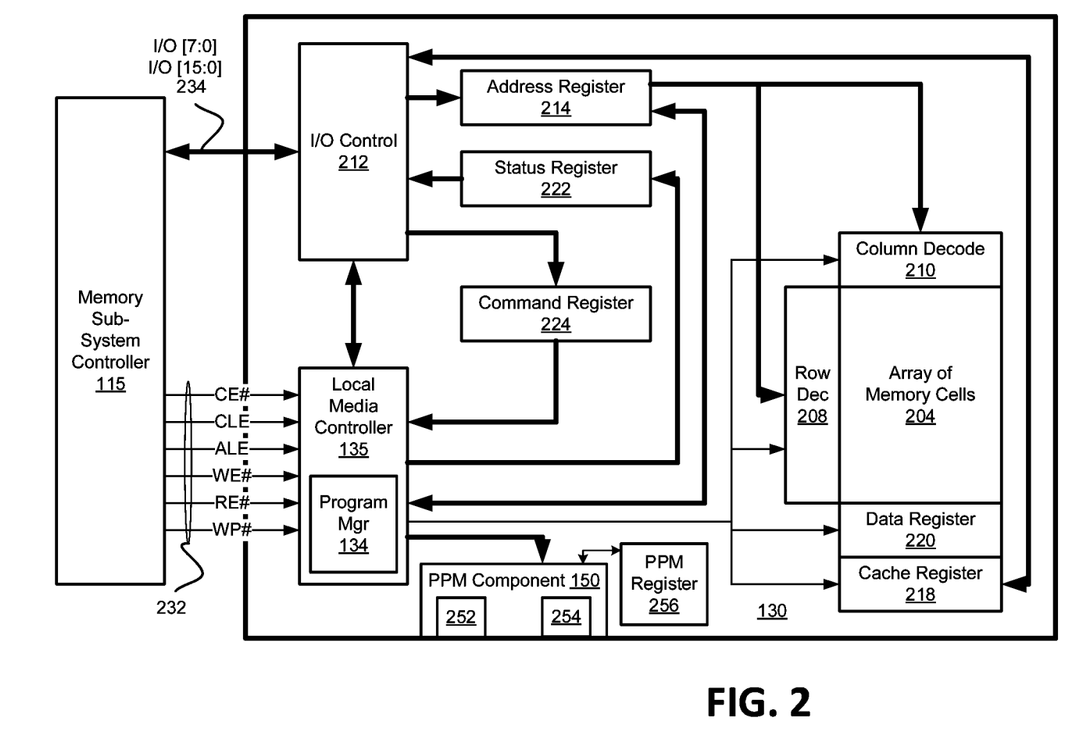
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

Figure 3:
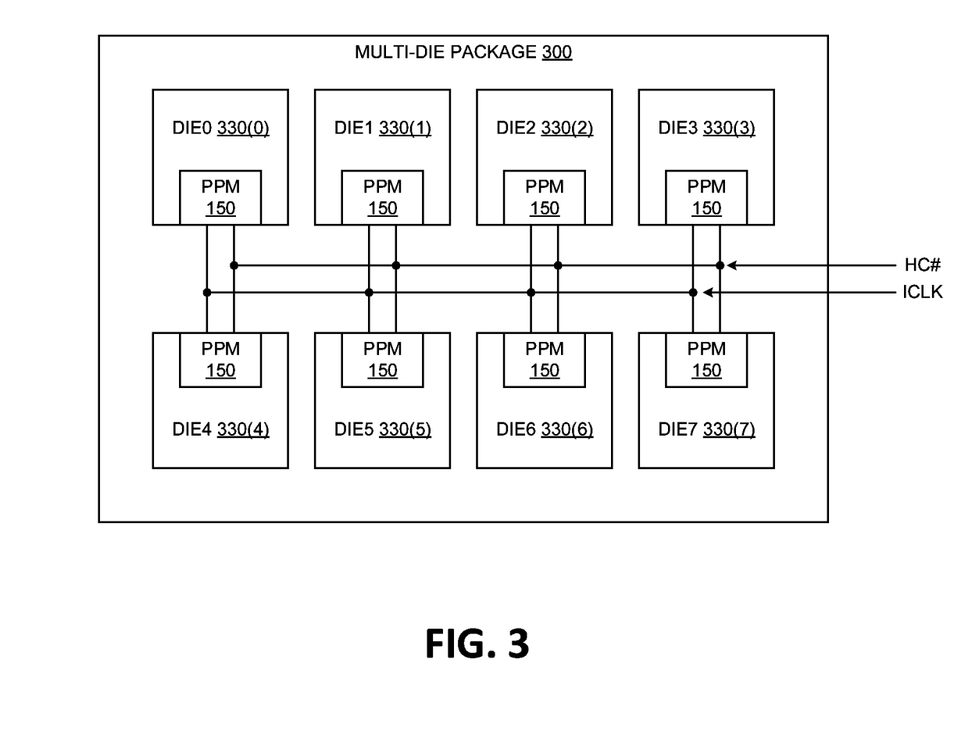
FIG. 3 is a block diagram illustrating a multi-die package with multiple memory dies in a memory sub-system in accordance with some embodiments of the present disclosure.

In one embodiment, memory device 130 includes PPM component 150. In one embodiment, PPM component 150 includes two signal pads, such as pads 252 and 254. Pads 252 and 254 can be connected to and form a communication interface with separate wires, signal lines, or communication buses. For example, pad 252 can be connected to a clock signal line, such as clock signal ICLK as shown in FIG. 3, and pad 254 can be connected to a data signal line, such as data signal HC # as shown in FIG. 3. In one embodiment, the clock signal line and data signal line are commonly shared by each PPM component on each memory die of a multi-die package. As described herein, responsive to commands received from a requestor, such as memory sub-system controller 115, PPM component 150 can perform a connectivity check to verify proper physical connectivity between itself and the PPM components on the other memory die in memory sub-system 110. In one embodiment, test values are propagated between the PPM components via pad 254 and received test values are stored in a register associated with PPM component 150, such as PPM register 256 for later comparison with a set of expected values.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

FIG. 3 is a block diagram illustrating a multi-die package with multiple memory dies in a memory sub-system in accordance with some embodiments of the present disclosure. As illustrated, multi-die package 300 includes eight memory dies 330(0)-330(7), any of which can be one representation of memory device 130, as shown in FIG. 1 and FIG. 2. In other embodiments, however, multi-die package 300 can include some other number of memory dies, such as additional or fewer memory dies. In one embodiment, memory dies 330(0)-330(7) share a clock signal ICLK which is received via a clock signal line. Memory dies 330(0)-330(7) can be selectively enabled in response to a chip enable signal (e.g. via a control link), and can communicate over a separate I/O bus. In addition, a peak current magnitude indicator signal HC # is commonly shared between the memory dies 330(0)-330(7). The peak current magnitude indicator signal HC # can be normally pulled to a particular state (e.g., pulled high). In one embodiment, each of memory dies 330(0)-330(7) includes an instance of PPM component 150, which includes signal pads, such as pads 252 and 254, to receive both the clock signal ICLK and the peak current magnitude indicator signal HC #.

In one embodiment, a token-based protocol is used where a token cycles through each of the memory dies 330(0)-330(7) for determining and broadcasting expected peak current magnitude, even though some of the memory dies 330(0)-330(7) might be disabled in response to their respective chip enable signal. The period of time during which a given PPM component 150 holds this token (e.g. a certain number of cycles of clock signal ICLK) can be referred to herein as a power management cycle of the associated memory die. At the end of the power management cycle, the token is passed to a next memory die in sequence. Eventually the token is received again by the same PPM component 150 which signals the beginning of a new power management cycle for the associated memory die and the completion of a PPM token loop (i.e., when the token has been based through each of the memory dies 330(0)-330(7) in multi-die package 300). In one embodiment, the encoded value for the lowest expected peak current magnitude is configured such that each of its digits correspond to the normal logic level of the peak current magnitude indicator signal HC # where the disabled dies do not transition the peak current magnitude indicator signal HC #. In other embodiments, however, the memory dies can be configured, when otherwise disabled in response to their respective chip enable signal, to drive transitions of the peak current magnitude indicator signal HC # to indicate the encoded value for the lowest expected peak current magnitude upon being designated.

When a given PPM component 150 holds the token, it can determine the peak current magnitude for the respective one of memory die 330(0)-330(7), which can be attributable to one or more processing threads on that memory die, and broadcast an indication of the same via the peak current magnitude indicator signal HC #. As described in more detail below, PPM component 150 can further perform a connectivity check to verify proper physical connectivity between the PPM components on each die in the package, as well as proper operation of the PPM system itself. In one embodiment, a given PPM component, such as the PPM component 150 on memory die 330(0) sends a test value to one or more other PPM components 150 on one or more other memory dies, such as the PPM components 150 on memory dies 330(1)-330(7), and receives one or more other test values from the one or more other PPM components. Any of the PPM components, such as the PPM component 150 on memory die 330(0) for example, compares the test value and the one or more other test values to a set of expected values. Responsive to the test value and the one or more other test values matching the set of expected values, the PPM component 150 determines that signal connections between the PPM component 150 on memory die 330(0) and the PPM components 150 on memory dies 330(1)-330(7) are functional. Responsive to the test value and the one or more other test values not matching the set of expected values, the PPM component 150 determines that there is a wire bond failure or other connectivity fault between the PPM component 150 on memory die 330(0) and the PPM components 150 on memory dies 330(1)-330(7).

Figure 4:
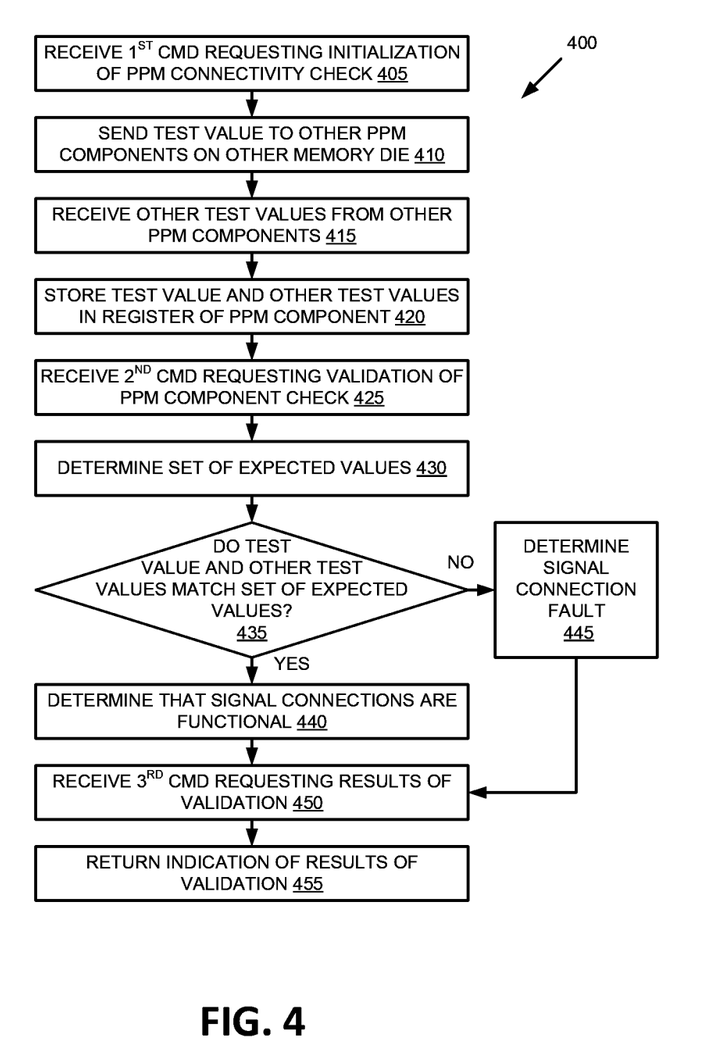
FIG. 4 is a flow diagram of an example method of performing a peak power management connectivity check in a memory device of a memory sub-system in accordance with some embodiments of the present disclosure.

FIG. 4 is a flow diagram of an example method of performing a peak power management connectivity check in a memory device of a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by PPM component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a command is received. For example, processing logic (e.g., the PPM components 150 on each of memory dies 330(0)-330(7) in multi-die package 300) can receive the command, such as an NVME set feature (SETF) command, from a requestor, such as memory sub-system controller 115 of a memory sub-system. In one embodiment, the command includes a feature value indicating a request for initialization of a PPM component connectivity check on the memory device. In one embodiment, the command further includes one or more pages of information, such as a first page including a fixed value indicating the PPM connectivity check algorithm, a second page including a seed value and a test value scheme, and a third page indicating a delay time indicator. The command can optionally include one or more additional pages of information which can be empty or include some other default value. In one embodiment, the same command is received by the PPM component 150 on each of memory dies 330(0)-330(7) in multi-die package 300.

At operation 410, a test value is sent. In one embodiment, the processing logic (e.g., one PPM component 150) can send a test value to one or more other PPM components on one or more other memory dies during a first power management cycle. The first power management cycle can be defined by a certain number of cycles of the shared clock ICLK, during which the PPM component 150 holds the power management token. For example, if PPM component 150 on memory die 330(0) holds the power management token during the first power management cycle, that PPM component 150 can broadcast the test value to the other PPM components on memory dies 330(1)-330(7) via shared data signal HC #. In one embodiment, the test value is based on the seed value and the test value scheme, and can include a three-bit value. For example, the test value can be the seed value received with the command at operation 405, or some variant of the seed value (e.g., the inverse or an increment of the seed value) according to the test value scheme.

At the end of the first power management cycle, the power management token is passed to a next PPM component (e.g., the PPM component 150 on memory die 330(1)). Thus, during a second power management cycle, that PPM component 150 can broadcast a second test value to the other PPM components on memory dies 330(0) and 330(2)-330(7) via shared data signal HC #. The second test value is received by all of the other PPM components, including the PPM component 150 on memory die 330(0). The power management cycles continue according to shared clock signal ICLK with each PPM component taking a turn to broadcast a respective test value (collectively "other test values") to the other PPM components.

At operation 415, other test values are received. Upon completion of each PPM component on each of the memory dies in the multi-package having held the token and broadcasted the respective test value for a respective power management cycle, one power management token loop is complete, and the power management token returns to the initial PPM component. Thus, at the end of the power management token loop, each PPM component 150 should have received a respective test value from each other PPM component.

At operation 420, the received test values are stored. For example, the processing logic in each PPM component 150 can store these received test values, as well as its own test value, in an associated register, such as PPM register 256. The test value scheme can define how the respective test values sent by each PPM component 150 relate to one another. In one embodiment, the test value scheme is an even/odd or alternating scheme. In this embodiment, alternating ones of the respective test values include an inverse of the seed value, with the remaining respective test values including the seed value itself. For example, if the PPM component 150 on memory die 330(0) sends the seed value, PPM component 150 on memory die 330(1) sends an inverse of the seed value (i.e., where each of the three bits is inverted), PPM component 150 on memory die 330(2) sends the seed value, PPM component 150 on memory die 330(3) sends an inverse of the seed value, and so on. In another embodiments, the test value scheme is an incremental scheme. In this embodiment, each respective test value includes a respective increment of the seed value. For example, if the PPM component 150 on memory die 330(0) sends the seed value, PPM component 150 on memory die 330(1) sends a first increment seed value (e.g., the seed value plus one), PPM component 150 on memory die 330(2) sends a second increment seed value (e.g., the seed value plus two), and so on. In other embodiments, other test value schemes are possible.

At operation 425, a command is received. For example, the processing logic can receive the command, such as an NVME set feature (SETF) command, from a requestor, such as memory sub-system controller 115 of a memory sub-system. In one embodiment, the command includes a feature value indicating a request for validation of the PPM component connectivity check on the memory device. In one embodiment, the command further includes one or more pages of information, such as a first page including a fixed value indicating the request for validation and a second page including the seed value and a test value scheme. The command can optionally include one or more additional pages of information which can be empty or include some other default value. In one embodiment, the same command is received by the PPM component 150 on each of memory dies 330(0)-330(7) in multi-die package 300.

At operation 430, a set of expected values is determined. For example, the processing logic can determine the set of expected values based on the seed value and the test value scheme received in the command at operation 425. The set of expected values represents the values that were broadcast by each PPM component 150 and that would be received and stored in the associated registers, such as PPM register 256, if all the signal connections between the PPM components 150 are functional. Thus, depending on the test value scheme, the set of expected values can represent alternating test values, incremented test values, or some other set of values. In one embodiment, each PPM component 150 on each memory die in the multi-die package can determine a respective set of expected values.

At operation 435, values are compared. For example, the processing logic can compare the test values to the set of expected test values determined at operation 430. In one embodiment, the PPM component 150 can read the received test values from PPM register 256 and compare each test value to a corresponding expected test value in the set of expected test values. A test value is said to match the corresponding expected test value when the values are the same. If the test values match the set of expected test values, at operation 440, it can be determined that the signal connections between the PPM components are functional. If one or more of the test values do not match the set of expected test values, at operation 445, it can be determined that there is a signal connection fault (e.g., a wire bond failure) between the PPM components.

At operation 450, a command is received. For example, the processing logic can receive the command, such as an NVME get feature (GETF) command, from a requestor, such as memory sub-system controller 115 of a memory sub-system. In one embodiment, the command includes a feature value indicating a request for results of the validation of the PPM component connectivity check on the memory device. At operation 455, results are returned. For example, the processing logic can return, to the requestor, an indication of the results of the validation of the PPM component connectivity check. In one embodiment, the indication includes one or more values indicating whether each of the test values matches the corresponding value in the set of expected values. The requestor can decode these one or more values to identify the PPM component(s), if any, which are suffering from a PPM component connectivity fault.

Figure 5:
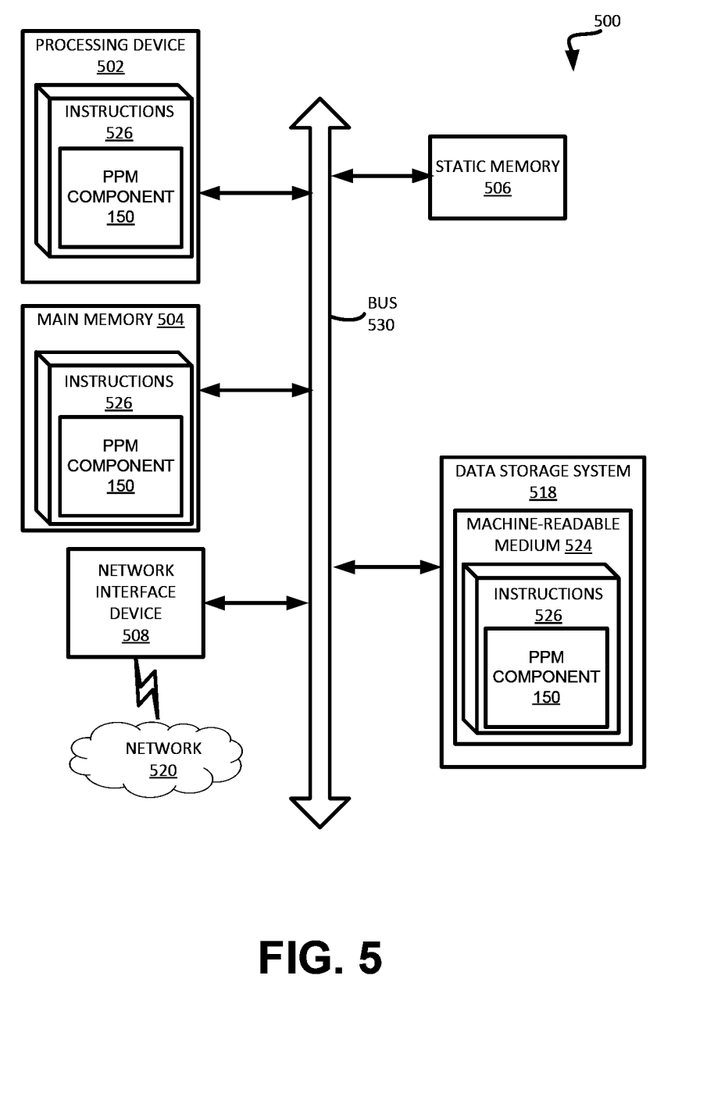
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to PPM component 150 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium, such as a non-transitory computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to PPM component 150 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a plurality of memory dies, each memory die of the plurality of memory dies comprising:
a memory array; and
a peak power management component, operatively coupled with the memory array, wherein the peak power management component is to perform operations comprising:
sending a test value to one or more other peak power management components on one or more other memory dies of the plurality of memory dies during a first power management token loop;
receiving one or more other test values from the one or more other peak power management components during the first power management token loop, wherein at least one of the one or more other test values is different than the test value, and wherein the test value and the one or more other test values are derived from a seed value according to a defined test value scheme;
comparing the test value and the one or more other test values to a set of expected values; and
responsive to the test value and the one or more other test values matching the set of expected values, determining that signal connections between the peak power management component and the one or more other peak power management components are functional.

2. The memory device of claim 1, wherein the peak power management component is to perform further operations comprising:
receiving a first command requesting initialization of a peak power management component connectivity check on the memory device, wherein the first command comprises an indication of the seed value and the test value scheme.

3. The memory device of claim 2, wherein the peak power management component is to perform further operations comprising:
storing the test value and the one or more other test values in a register associated with the peak power management component.

4. The memory device of claim 3, wherein the peak power management component is to perform further operations comprising:
receiving a second command requesting validation of the peak power management component connectivity check on the memory device, wherein the second command comprises an indication of the seed value and the test value scheme.

5. The memory device of claim 4, wherein the peak power management component is to perform further operations comprising:
responsive to receiving the second command, determining the set of expected values based on the seed value and the test value scheme, wherein comparing the test value and the one or more other test values to a set of expected values comprises reading the test value and the one or more other test values from the register.

6. The memory device of claim 5, wherein the peak power management component is to perform further operations comprising:
receiving a third command requesting results of the validation; and
responsive to receiving the third command, returning an indication of the results of the validation, the indication indicating whether the test value and the one or more other test values match the set of expected values.

7. The memory device of claim 1, wherein, according to the test value scheme, the test value comprises the seed value, and wherein alternating ones of the one or more other test values comprise an inverse of the seed value.

8. The memory device of claim 1, wherein, according to the test value scheme, the test value comprises the seed value, and wherein respective ones of the one or more other test values comprise an increment of the seed value.

9. A method comprising:
sending, by a peak power management component on a memory die, a test value to one or more other peak power management components on one or more other memory dies of a plurality of memory dies during a first power management token loop;
receiving one or more other test values from the one or more other peak power management components during the first power management token loop, wherein at least one of the one or more other test values is different than the test value, and wherein the test value and the one or more other test values are derived from a seed value according to a defined test value scheme;

comparing the test value and the one or more other test values to a set of expected values; and responsive to the test value and the one or more other test values matching the set of expected values, determining that signal connections between the peak power management component and the one or more other peak power management components are functional.

10. The method of claim 9, further comprising:

receiving a first command requesting initialization of a peak power management component connectivity check on the plurality of memory dies, wherein the first command comprises an indication of the seed value and the test value scheme.

11. The method of claim 10, further comprising:

storing the test value and the one or more other test values in a register associated with the peak power management component.

12. The method of claim 11, further comprising:

receiving a second command requesting validation of the peak power management component connectivity check on the plurality of memory dies, wherein the second command comprises an indication of the seed value and the test value scheme.

13. The method of claim 12, further comprising:

responsive to receiving the second command, determining the set of expected values based on the seed value and the test value scheme, wherein comparing the test value and the one or more other test values to a set of expected values comprises reading the test value and the one or more other test values from the register.

14. The method of claim 13, further comprising:

receiving a third command requesting results of the validation; and responsive to receiving the third command, returning an indication of the results of the validation, the indication indicating whether the test value and the one or more other test values match the set of expected values.

15. The method of claim 9, wherein, according to the test value scheme, the test value comprises the seed value, and wherein alternating ones of the one or more other test values comprise an inverse of the seed value.

16. The method of claim 9, wherein, according to the test value scheme, the test value comprises the seed value, and wherein respective ones of the one or more other test values comprise an increment of the seed value.

17. A memory device comprising:

a plurality of memory dies; and a peak power management system, the power management system comprising respective peak power management components disposed on each memory die of the plurality of memory dies, wherein a first peak power management component of a first memory die of the plurality of memory dies is configured to send a first test value to a remainder of the plurality of memory dies during a first period of time of a first power management token loop when the first peak power management component holds a token, wherein the first period of time is measured by a clock signal shared by the plurality of memory dies, wherein a second peak power management component of a second memory die of the plurality of memory dies is configured to send a second test value to the remainder of the plurality of memory dies during a second period of time of the first power management token loop when the second peak power management component holds the token, wherein the second period of time is measured by the clock signal shared by the plurality of memory dies, wherein the second test value is different than the first test value, and wherein the first test value and the second test value are based on a seed value and a test value scheme received from a controller associated with the memory device, and wherein the first peak power management component is configured to compare the first test value and the second test value to a set of expected values to validate operation of the first peak power management component and the second peak power management components.

* * * * *